United States Patent [19]

Cruz et al.

[11] Patent Number: 5,054,117
[45] Date of Patent: Oct. 1, 1991

[54] TUNABLE UHF FILTER FOR SWITCHABLE VHF/UHF RECEIVER

[75] Inventors: Michael S. Cruz, Buffalo Grove; Harmon P. Vaughter, Evanston, both of Ill.

[73] Assignee: Zenith Electronics Corporation, Glenview, Ill.

[21] Appl. No.: 388,531

[22] Filed: Aug. 1, 1989

[51] Int. Cl.⁵ ............................................. H04B 1/10
[52] U.S. Cl. .................................. 455/189; 455/191; 455/285; 455/302
[58] Field of Search ............... 455/188, 189, 190, 191, 455/195, 285, 302, 340, 180

[56] References Cited

U.S. PATENT DOCUMENTS

| | | | |
|---|---|---|---|
| 2,075,683 | 3/1937 | Wheeler | 455/285 |
| 2,449,148 | 9/1948 | Sands | 455/285 |
| 4,048,598 | 9/1977 | Knight | 334/15 |
| 4,118,679 | 10/1978 | Hiday et al. | 334/1 |
| 4,207,530 | 6/1980 | Gallagher | 455/174 |
| 4,271,529 | 6/1981 | Strammello, Jr. | 455/180 |
| 4,322,856 | 3/1982 | Ohta et al. | 455/189 |
| 4,361,909 | 11/1982 | Theriault | 455/340 |
| 4,363,135 | 12/1982 | Moon | 455/180 |
| 4,380,828 | 4/1983 | Moon | 455/319 |
| 4,435,841 | 3/1984 | Dobrovolny | 455/180 |
| 4,601,062 | 7/1986 | Hettiger | 455/286 |
| 4,662,001 | 4/1987 | Cruz et al. | 455/340 |
| 4,756,024 | 7/1988 | Kupfer | 455/188 |
| 4,905,306 | 2/1990 | Anderson | 455/191 |

Primary Examiner—Curtis Kuntz
Assistant Examiner—Edward Urban

[57] ABSTRACT

A tunable/switchable notch filter adapted for use in the front end of a television receiver removes an image frequency on the low side of the UHF passband without degrading desired frequencies. The tunable/switchable notch filter can be switched out when in a VHF mode so as not to degrade VHF performance and switched in for UHF operation for filtering out a difference image frequency which varies with and is a predetermined frequency less than the desired UHF signal.

12 Claims, 1 Drawing Sheet

TUNABLE UHF FILTER FOR SWITCHABLE VHF/UHF RECEIVER

BACKGROUND OF THE INVENTION

This invention relates generally to RF filter circuits and is particularly directed to a tunable/switchable notch filter for the front end of an RF receiver for removing a difference image frequency.

A conventional radio frequency (RF) signal receiver includes an RF section and an intermediate frequency (IF) section. The RF section includes tuned RF filters to provide coarse filtering for a band of frequencies centered about a selected channel. The output of the RF filters is provided to an RF amplifier which, in turn, provides one input to a mixer circuit. A second input of the mixer circuit receives a signal from a local oscillator which is offset in frequency from the selected channel by a given amount for generating a heterodyned, lower IF signal. In generating this IF signal, a local oscillator frequency greater than that of the RF signal is used. In the RF signal, the video carrier frequency is less than the sound carrier frequency and the video IF is at a higher frequency than the sound IF. Because the local oscillator frequency is greater than that of the desired RF signal, care must be taken to filter out the various image frequencies and harmonics thereof which are greater than the RF frequency.

In some applications, a particular channel is used for receiving a number of channel frequencies. For example, channel 3 is commonly used for processing CATV channels in a conventional television receiver, wherein the CATV channel frequencies are converted to a television receiver's channel 3 frequency. This presents problems unlike those encountered during processing of RF and IF signals in the VHF and UHF bands. For example, the channel 3 frequency makes use of an audio IF signal greater in frequency than the video IF signal. This results in an inversion of these IF signals in terms of the normal processing of these signals, with the carriers appearing at the wrong frequencies. This problem has been addressed in the past by modulating the output of the cable converter to the television receiver in order to provide the standard intermediate frequencies. This signal modulation requires an appropriate modulation system, increasing the cost and complexity of the CATV converter and/or the television receiver.

The present invention addresses and overcomes the aforementioned limitations of the prior art by providing a tunable/switchable notch filter for improved spurious signal rejection on the low side of a television receiver tuner bandpass. The notch filter is variably tuned to an image frequency two times the IF on the low side of the desired RF signal and is disposed in the television receiver's front end.

OBJECTS OF THE INVENTION

Accordingly, it is an object of the present invention to provide an improved RF signal filter particularly adapted for use in a multi-band television receiver.

It is another object of the present invention to provide improved spurious signal rejection on the low side of the bandpass in an RF tuner.

Still another object of the present invention is to provide a tunable and switchable notch filter for rejecting unwanted signals a predetermined frequency below the desired RF signal.

A further object of the present invention is to provide a tunable/switchable notch filter for an RF receiver such as used in CATV systems which provides filtering over the UHF band, but is switched out when in the VHF mode so as not to degrade VHF performance.

Yet another object of the present invention is to filter out spurious signals in an RF receiver at the receiver's front end before such spurious signals reach the receiver's tuner.

BRIEF DESCRIPTION OF THE DRAWINGS

The appended claims set forth those novel features which characterize the invention. However, the invention itself, as well as further objects and advantages thereof, will best be understood by reference to the following detailed description of a preferred embodiment taken in conjunction with the accompanying drawings, where like reference characters identify like elements throughout the various figures, in which:

DETAILED DESCRIPTION OF THE PREFERRED EMBODIMENTS

Figure 1:
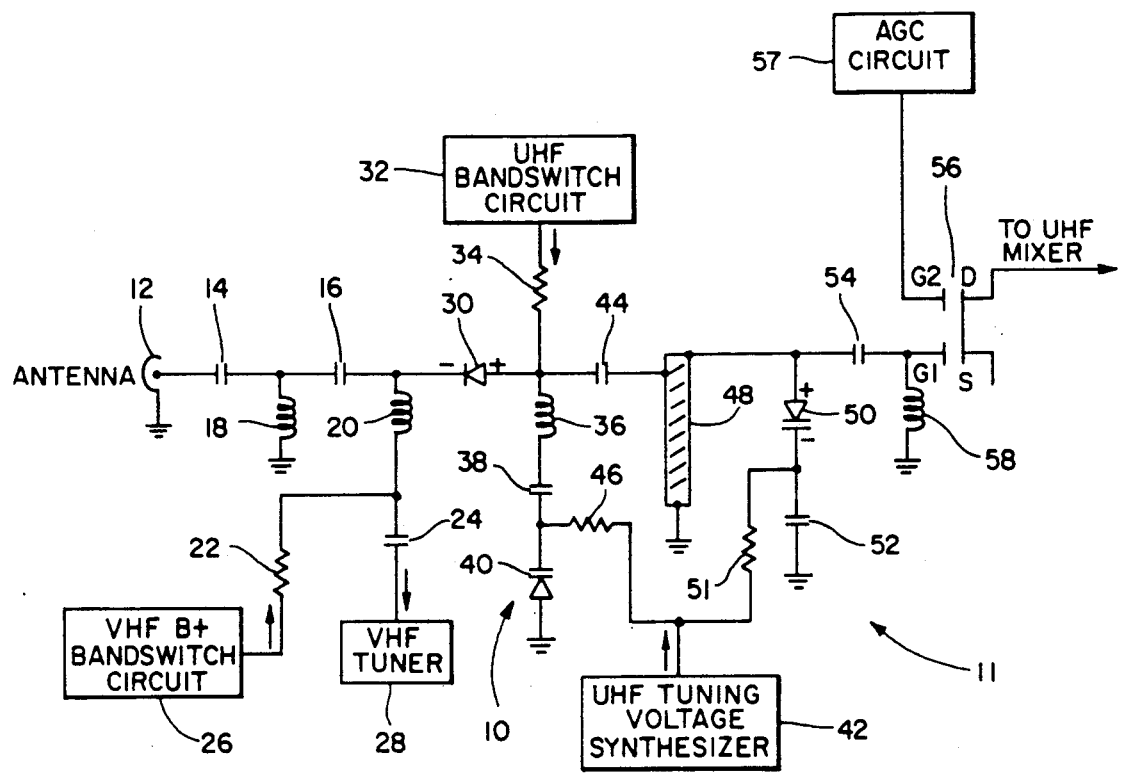
FIG. 1 is a simplified combined schematic and block diagram of a tunable/switchable notch filter in accordance with the principles of the present invention.

Referring to FIG. 1, there is shown a simplified combined schematic and block diagram of a tunable/switchable notch filter 10 in accordance with the principles of the present invention. The tunable/switchable notch filter 10 is described below for use in processing CATV channels transmitted over the channel 3 frequency band of 60 to 66 MHz. However, the present invention is adapted for use at virtually any multi-band RF signal receiver where the local oscillator frequency is less than the RF signal frequency.

The tunable/switchable notch filter 10 is incorporated in the front end of an RF receiver 11 and is coupled to and receives an RF signal from an antenna 12. The front end of the tunable/switchable notch filter 10 includes serially coupled capacitors 14 and 16 in combination with inductors 18 and 20. Capacitors 14, 16 and inductors 18, 20 form a high pass filter having a cutoff frequency on the order of 61 MHz, where the picture carrier IF is 61.25 MHz and the sound carrier IF is 65.75 MHz for channel 3. The high pass filter of capacitors 14, 16 and inductors 18, 20 thus cuts off all frequencies below approximately 61 MHz.

The cathode of a switching diode 30 is coupled to the aforementioned high pass filter for transmitting UHF signals. The cathode of the switching diode 30 is further coupled via inductor 20 and a resistor 22 and a capacitor 24 to a VHF B+ bandswitch circuit 26 and a VHF tuner circuit 28. A VHF B+ bandswitch input is provided to the switching diode 30 from the bandswitch circuit 26 in order to reverse bias the diode to block received VHF signals. With the switching diode 30 reverse biased, or nonconductive, a received vHF signal is provided from the high pass filter via series coupled inductor 20 and coupling capacitor 24 to the VI!F tuner circuit 28. Capacitor 24 provides an AC coupling as well as a DC blocking function.

A UHF bandswitch input circuit 32 is coupled via a resistor 34 to the anode of switching diode 30 and provides a UHF bandswitch input thereto. When the UHF bandswitch input is provided to the anode of the switching diode 30, the switching diode is forward biased and provides a received UHF signal to the tunable/switchable notch filter 10 comprised of inductor 36, capacitor 38, and varactor diode 40. Inductor 36 in combination with capacitor 38 and varactor diode 40 forms a tunable series resonant circuit which provides a notch frequency below the desired RF frequency. A UHF tuning voltage synthesizer 42 is coupled to the cathode of the grounded varactor diode 40 for providing a tuning voltage thereto via resistor 46 in establishing the resonant frequency of the tunable/switchable notch filter. The capacitance of varactor diode 40 is thus controlled by the tuning voltage provided to its cathode via resistor 46 from the UHF tuning voltage synthesizer 42.

The UHF tuning voltage synthesizer 42 is also coupled to the cathode of a second varactor diode 50 via resistor 51. The cathode of the second varactor diode 50 is coupled to neutral ground potential via capacitor 52. The UHF tuning voltage is thus also provided to a UHF tunable circuit including the second varactor diode 50 as well as an AC coupling/DC blocking capacitor 44 and a grounded line 48. The line 48 functions as an inductor forming a resonant circuit with capacitor 44 and varactor diode 50. The frequency of this resonant circuit is controlled by the UHF tuning voltage synthesizer output provided to the cathode of varactor diode 50. With the first and second resonant circuits respectively including varactor diodes 40 and 50 and tuned to the desired UHF signal, this UHF signal is provided via RF coupling capacitor 54 to the G1 gate of a dual gate field energized transistor (FET) 56. Grounded inductor 58 coupled between coupling capacitor 54 and gate G1 of FET 56 serves as an impedance matching coil. The FET 56 also includes a G2 gate to which an automatic gain control (AGC) input may be provided from an AGC circuit 57. The output of the FET 56 is typically provided via its drain (D) to a mixer circuit in a UHF tuner for tuning the RF receiver to the desired UHF signal.

Figure 2:
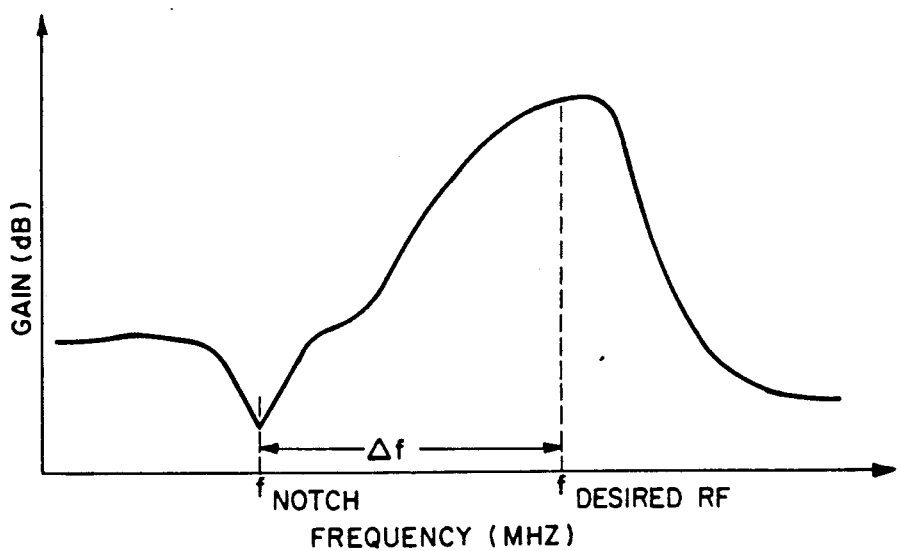
FIG. 2 is a graphic illustration of the rejection of undesired frequencies on the low side of the bandpass provided by the tunable/switchable notch filter of the present invention.

Referring to FIG. 2, there is a graphic illustration of the relationship between the notch frequency ($f_{NOTCH}$) and the desired RF signal frequency ($f_{DESIRED\ RF}$). As shown in FIG. 2, there is a difference in frequency f between the RF signal which it is desired to tune to and the notch frequency of the tunable/switchable notch filter of the present invention. While $\Delta f$ assumes an essentially constant value, i.e., on the order of 122 MHz for channel 3 where the picture and sound carrier IFs are respectively 61.25 and 65.75 MHz, $f_{NOTCH}$ varies with $f_{DESIRED\ RF}$. Thus, as the desired RF signal increases in frequency, the notch frequency will undergo a corresponding increase so as to remain approximately 122 MHz less than the desired RF signal for image frequency rejection. The tunable/switchable notch filter of the present invention thus provides filtering over the entire UHF band and is switched out of the circuit when the circuit is switched to the VHF band.

There has thus been shown a tunable/switchable notch filter particularly adapted for the front end of a multi-band RF receiver having low side injection of the local oscillator signal. The tunable/switchable notch filter provides spurious signal rejection on the low side of the bandpass by tuning the notch filter to a frequency on the order of two times the difference between the RF and local oscillator frequencies. The tunable/switchable notch filter is switched in for operation over a first frequency band and is removed when the receiver is tuned to a second band.

While particular embodiments of the present invention have been shown and described, it will be obvious to those skilled in the art that changes and modifications may be made without departing from the invention in its broader aspects. Therefore, the aim in the appended claims is to cover all such changes and modifications as fall within the true spirit and scope of the invention. The matter set forth in the foregoing description and accompanying drawings is offered by way of illustration only and not as a limitation. The actual scope of the invention is intended to be defined in the following claims when viewed in their proper perspective based on the prior art.

We claim:

1. Apparatus for use in a multi-band RF signal receiver wherein a lower frequency local oscillator signal is heterodyned with a higher frequency RF signal to produce an IF signal, the apparatus comprising:

a VHF bandswitch circuit and a VHF tuner circuit;

a UHF bandswitch circuit and a UHF tuning voltage circuit;

a UHF tunable circuit coupled to said UHF tuning voltage circuit and responsive to a tuning voltage output therefrom for tuning to a desired UHF signal frequency;

switch means coupled to said UHF tunable circuit and to said VHF and UHF bandswitch circuits and responsive to respective outputs therefrom for either blocking a received VHF signal from said UHF tunable circuit when a VHF signal is selected or transmitting a received UHF signal to said UHF tunable circuit, when a UHF signal is selected wherein said switch means is further coupled ti said VHF tuner circuit for directing a blocked VHF signal thereto; and tunable filter means coupled ti said switch means and to said UHF tuning voltage circuit and responsive to said tuning voltage output therefrom for filtering out of the desired UHF signal an IF image frequency on the low side of the desired UHF signal, wherein said tunable filter means is tuned to an IF image frequency equal to the desired UHF signal frequency minus twice the IF signal frequency.

2. The apparatus of claim 1 wherein said switch means is coupled to an antenna of the RF signal receiver via a high pass filter.

3. The apparatus of claim 2 wherein said switch means includes a switching diode.

4. The apparatus of claim 1 wherein said tunable filter means includes, in combination, an inductance and a variable capacitance.

5. The apparatus of claim 4 wherein said variable capacitance includes a grounded varactor diode coupled to said UHF tuning voltage circuit.

6. The apparatus of claim 1 wherein the RF signal receiver operates over the VHF and UHF bands and wherein said switch means switches out said UHF tunable circuit and said tunable filter means over the VHF band and directs a received VHF signal to said VHF tuner circuit.

7. In a television receiver including a VHF tuned circuit, a UHF tuned circuit and VHF and UHF bandswitch circuits, wherein a received VHF or UHF signal is heterodyned with a local oscillator signal for providing an IF signal and wherein the local oscillator signal has a frequency less than the frequency of said RF signal, a filter circuit comprising:
  switch means coupled to said UHF tuned circuit and to said VHF and UHF bandswitch circuits and responsive to respective bandswitch outputs therefrom for either blocking a VHF signal from the UHF tuned circuit when a VHF signal is selected or transmitting a UHF signal to the UHF tuned circuit when a UHF signal is selected; and
  first tunable circuit means coupled to said switch means and to a UHF tuning source and responsive to a UHF tuning voltage output therefrom for providing a desired UHF signal to the UHF tuned circuit and filtering out an image signal, wherein said first tunable circuit means is tuned to an IF image frequency on the low side of the desired UHF signal equal to the desired UHF signal frequency minus twice the IF signal frequency.

8. The filter circuit of claim 7 further comprising second tunable circuit means, wherein said second tunable circuit means is tuned to said desired UHF signal.

9. The filter circuit of claim 8 wherein said first and second tunable circuit means include first and second variable capacitances in combination with first and second inductances, respectively.

10. The filter circuit of claim 9 wherein each of said first and second variable capacitances is a varactor diode.

11. The filter circuit of claim 9 wherein said first variable capacitance is coupled to ground potential and said second variable capacitance is coupled to the UHF tuned circuit.

12. The filter circuit of claim 7 wherein said switch means includes a switching diode coupled to the VHF tuned circuit for blocking said VHF signal from the UHF tuned circuit and providing said VHF signal to said VHF tuned circuit.

* * * * *